United States Patent
Lee et al.

(10) Patent No.: US 10,237,018 B2
(45) Date of Patent: Mar. 19, 2019

(54) COMMUNICATION DEVICE AND COMMUNICATION METHOD

(71) Applicant: LSIS CO., LTD., Anyang-si, Gyeonggi-do (KR)

(72) Inventors: Sung Han Lee, Anyang-si (KR); Dae Hyun Kwon, Anyang-si (KR); Joon Seok Oh, Gunpo-si (KR)

(73) Assignee: LSIS CO., LTD., Anyang-si, Gyeonggi-Do (KR)

( * ) Notice: Subject to any disclaimer, the term of this patent is extended or adjusted under 35 U.S.C. 154(b) by 0 days.

(21) Appl. No.: 14/382,523

(22) PCT Filed: Oct. 22, 2012

(86) PCT No.: PCT/KR2012/008653
§ 371 (c)(1),
(2) Date: Sep. 2, 2014

(87) PCT Pub. No.: WO2013/129751
PCT Pub. Date: Sep. 6, 2013

(65) Prior Publication Data
US 2015/0067455 A1    Mar. 5, 2015

Related U.S. Application Data

(60) Provisional application No. 61/605,754, filed on Mar. 2, 2012.

(51) Int. Cl.
*H04L 1/00* (2006.01)
*G06F 11/10* (2006.01)
(Continued)

(52) U.S. Cl.
CPC ........ *H04L 1/0061* (2013.01); *G06F 11/1004* (2013.01); *H03M 13/09* (2013.01);
(Continued)

(58) Field of Classification Search
CPC ..... H04L 69/22; H04L 1/0075; H04L 1/0041; H04L 1/0045; H04L 1/0061;
(Continued)

(56) References Cited

U.S. PATENT DOCUMENTS 4,716,566 A * 12/1987 Masuhara ............. H03M 13/19
714/758
5,535,229 A * 7/1996 Hain, Jr. ............. H04B 7/18523
332/120

(Continued)

FOREIGN PATENT DOCUMENTS

| CN | 1145275 | 4/2004 |
|---|---|---|
| CN | 1810005 | 7/2006 |

(Continued)

OTHER PUBLICATIONS

PCT International Application No. PCT/KR2012/008653, Written Opinion of the International Searching Authority dated Mar. 25, 2013, 1 page.
(Continued)

*Primary Examiner* — April Y Blair
*Assistant Examiner* — Sazzad Hossain
(74) *Attorney, Agent, or Firm* — K&L Gates LLP (57) ABSTRACT

A first communication device calculates a plurality of data error codes for detecting an error in a plurality of data fields by using the plurality of data fields. The first communication device generates a packet comprising the plurality of data fields and the plurality of data error codes, and then transmits the packet which is generated to a second communication device.

2 Claims, 5 Drawing Sheets

(51) Int. Cl.
*H03M 13/09* (2006.01)
*H04L 1/24* (2006.01)
*H04L 29/06* (2006.01)
*H04L 29/08* (2006.01)

(52) U.S. Cl.
CPC .......... *H04L 1/0041* (2013.01); *H04L 1/0072* (2013.01); *H04L 1/24* (2013.01); *G06F 2212/403* (2013.01); *H04L 1/0045* (2013.01); *H04L 1/0075* (2013.01); *H04L 67/10* (2013.01); *H04L 69/22* (2013.01)

(58) Field of Classification Search
CPC ... H04L 1/0072; H04L 1/24; G06F 2212/403; G06F 11/1004; H03M 13/09
USPC ..... 375/240.27; 370/473, 476; 714/758, 776
See application file for complete search history.

(56) References Cited

U.S. PATENT DOCUMENTS

| | | | | |
|---|---|---|---|---|
| 6,075,552 | A * | 6/2000 | Hasegawa | H04H 20/12 348/192 |
| 6,782,503 | B1 * | 8/2004 | Dawson | H04L 12/2697 714/739 |
| 2001/0022780 | A1 * | 9/2001 | Mizutani | H04M 3/42 370/261 |
| 2002/0067758 | A1 | 6/2002 | D'Amico | |
| 2006/0280204 | A1 * | 12/2006 | Nagata | H04L 1/1671 370/473 |
| 2007/0234134 | A1 * | 10/2007 | Shao | H04L 1/0061 714/701 |
| 2008/0005496 | A1 | 1/2008 | Dreps et al. | |
| 2008/0195912 | A1 | 8/2008 | Mende et al. | |
| 2009/0307568 | A1 * | 12/2009 | Takaku | H04L 1/004 714/807 |
| 2009/0327826 | A1 * | 12/2009 | Inoue | H04L 1/1809 714/748 |
| 2013/0162190 | A1 * | 6/2013 | Smith | H02P 31/00 318/490 |

FOREIGN PATENT DOCUMENTS

| | | |
|---|---|---|
| CN | 101069377 | 11/2007 |
| CN | 101346915 | 1/2009 |
| CN | 101621471 | 1/2010 |
| CN | 101689959 | 3/2010 |
| EP | 2184878 | 5/2010 |
| JP | 2009-537883 | 10/2009 |
| JP | 2010-011296 | 1/2010 |
| JP | 2010-206394 | 9/2010 |
| KR | 10-2006-0024333 | 3/2006 |
| KR | 10-2008-0078051 | 8/2008 |
| KR | 10-2009-0129086 | 12/2009 |
| KR | 10-2010-0003227 | 1/2010 |
| WO | 99/49695 | 9/1999 |
| WO | 2009/008062 | 1/2009 |
| WO | 2011/139762 | 11/2011 |
| WO | 2012/009691 | 1/2012 |

OTHER PUBLICATIONS

European Patent Office Application Serial No. 12870260.2, Search Report dated Aug. 10, 2015, 13 pages.
Japan Patent Office Application Serial No. 2014-559811, Office Action dated Nov. 17, 2015, 3 pages.
Japan Patent Office Application Serial No. 2014-559811, Office Action dated Jul. 14, 2015, 3 pages.
Japan Patent Office Application Serial No. 2014-559811, Office Action dated May 31, 2016, 1 pages.
The State Intellectual Property Office of the People's Republic of China Application No. 201280072944.9, Office Action dated Dec. 13, 2016, 9 pages.

* cited by examiner

COMMUNICATION DEVICE AND COMMUNICATION METHOD

CROSS-REFERENCE TO RELATED APPLICATIONS

This application is the National Stage filing under 35 U.S.C. 371 of International Application No. PCT/KR2012/008653, filed on Oct. 22, 2012, which claims the benefit of U.S. Provisional Application Ser. No. 61/605,754, filed on Mar. 2, 2012, the contents of which are all hereby incorporated by reference herein in their entirety.

TECHNICAL FIELD

The present disclosure relates to a communication device and a communication method, and more particularly, to a safety communication device and a safety communication method.

BACKGROUND ART

Solutions for safety communication to be used in industrial fields are currently sought. In particular, industrial control systems are required to maintain a prescribed or higher level of integrity of information transferred via a network in order to secure the safety of workers, avoid threats to environment and prevent the occurrence of safety-related problems.

In order to satisfy such integrity requirements, industrial control systems are required to treat problems about corruption, unintended repetition, incorrect sequence, loss, unacceptable delay, insertion, masquerade and addressing.

Regarding the problem of corruption, industrial control systems should be able to determine whether an error occurs in data being transferred, with a prescribed or higher level of probability.

Regarding the problem of unintended repetition, industrial control systems should be able to determine whether data repetition which is not maliciously intended by a person occurs normally, with a prescribed or higher level of probability.

Regarding the problem of incorrect sequence, industrial control systems should be able to determine whether a sequence of transmission of data is changed, with a prescribed or higher level of probability.

Regarding the problem of loss, industrial control systems should be able to determine whether a part of transmitted data is damaged, with a prescribed or higher level of probability.

Regarding the problem of unacceptable delay, industrial control systems should be able to determine whether an unacceptable delay occurs in transmission of data, with a prescribed or higher level of probability.

Regarding the problem of insertion, industrial control systems should be able to determine whether unintended data is inserted while transmitting data, with a prescribed or higher level of probability.

Regarding the problem of masquerade, industrial control systems should be able to determine whether data is changed maliciously by a person, with a prescribed or higher level of probability.

Regarding the problem of addressing, industrial control systems should be able to determine whether data is transmitted to a right receiver, with a prescribed or higher level of probability.

IEC 61508 represents a probability of error occurrence using SIL as shown in table 1 below.

TABLE 1

| SIL4 | $>=10^{-9}, <10^{-8}$ |
| --- | --- |
| SIL3 | $>=10^{-8}, <10^{-7}$ |
| SIL2 | $>=10^{-7}, <10^{-6}$ |
| SIL1 | $>=10^{-6}, <10^{-5}$ |

For example, to satisfy SIL3, the probability of error occurrence should satisfy $10^{-9}$.

However, it is difficult for current Ethernet frame structures to satisfy the integrity requirements of industrial control systems.

DISCLOSURE OF THE INVENTION

Technical Problem

Embodiments provide a communication device and a communication method satisfying the integrity requirements of industrial control systems.

Technical Solution

In one embodiment, a communication method for transmitting, by a first communication device, data to a second communication device includes: calculating, by the first communication device, a plurality of data error detection codes for detecting an error of a plurality of data fields using the plurality of data fields; generating, by the first communication device, a packet including the plurality of data fields and the plurality of data error detection codes; and transmitting, by the first communication device, the packet to the second communication device.

In another embodiment, a communication method for receiving, by a first communication device, data from a second communication device includes: receiving, by the first communication device, a packet from the second communication device; obtaining, by the first communication device, a plurality of data fields and a plurality of received data error detection codes from the packet; calculating, by the first communication device, a plurality of comparative data error detection codes using the plurality of data fields; and determining, by the first communication device, whether the packet has an error using the plurality of received data error detection codes and the plurality of comparative data error detection codes.

Advantageous Effects

According to the embodiments of the present disclosure, the integrity requirements of industrial control systems can be satisfied.

MODE FOR CARRYING OUT THE INVENTION

Hereinafter, a mobile terminal related to an embodiment will be described in detail with reference to the accompanying drawings. In the following description, the terms "module" and "unit" for referring to elements are assigned thereto and used exchangeably for convenience, and thus, the terms per se do not necessarily represent different meanings or functions.

Hereinafter, a safety communication device and a safety communication method according to embodiments will be described with reference to the accompanying drawings.

Figure 1:
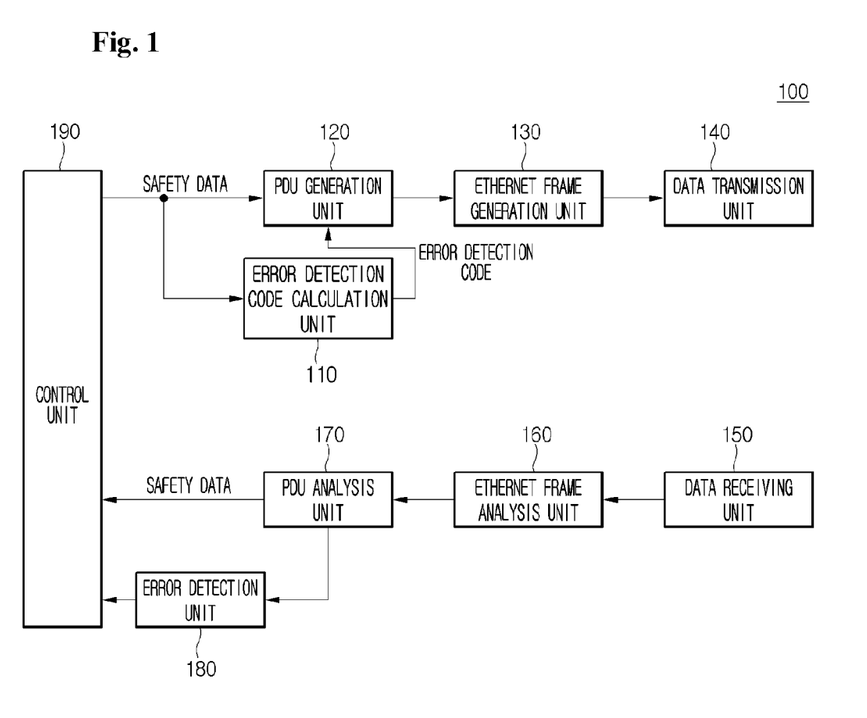
FIG. 1 is a block diagram illustrating a safety communication device according to an embodiment.

FIG. 1 is a block diagram illustrating a safety communication device according to an embodiment.

As illustrated in FIG. 1, a safety communication device 100 according to an embodiment includes an error detection code calculation unit 110, a protocol data unit (PDU) generation unit 120, an Ethernet frame generation unit 130, a data transmission unit 140, a data receiving unit 150, an Ethernet frame analysis unit 160, a protocol data unit analysis unit 170, an error detection unit 180, and a control unit 190.

The control unit 190 generates safety data, and provides the generated safety data to the error detection code calculation unit 110.

The error detection code calculation unit 110 calculates a data error detection code for the safety data using the safety data.

The protocol data unit generation unit 120 generates a safety protocol data unit including the calculated data error detection code and the generated safety data. Here, the safety protocol data unit may be referred to as a packet.

The Ethernet frame generation unit 130 generates an Ethernet frame including the generated safety protocol data unit.

The data transmission unit 140 transmits the generated Ethernet frame to another safety communication device. In this manner, the data transmission unit 140 transmits the generated safety protocol data unit to the other safety communication device.

The data receiving unit 150 receives the Ethernet frame including the safety protocol data unit from the other safety communication device.

The Ethernet frame analysis unit 160 analyzes the received Ethernet frame to obtain the safety protocol data unit.

The protocol data unit analysis unit 170 analyzes the protocol data unit to obtain the data error detection code and the safety data.

The error detection unit 180 calculates the data error detection code using the safety data, and then compares the calculated data error detection code with the obtained data error detection code to detect an error. In the case where the calculated data error detection code is equal to the obtained data error detection code, the error detection unit 180 determines that an error has not occurred in the safety data. On the contrary, in the case where the calculated data error detection code is different from the obtained data error detection code, the error detection unit 180 determines that an error has occurred in the safety data.

When it is determined that an error has occurred in the safety data, the control unit 190 changes an operation state of the safety communication device 100 into a fail-safe state. In the fail-safe state, the safety communication device 100 suspends safety communication until a user input for reset is received. In particular, in the fail-safe state, the safety communication device 100 may or may not suspend communication other than communication related to the safety data, but suspends at least the communication related to the safety data.

When it is determined that an error has not occurred in the safety data, the control unit 190 generates the safety data to be transmitted next. If the received safety data is related to a request, the control unit 190 generates the safety data related to a response. If the received safety data is related to a response, the control unit 190 generates the safety data related to a next request.

Figure 2:
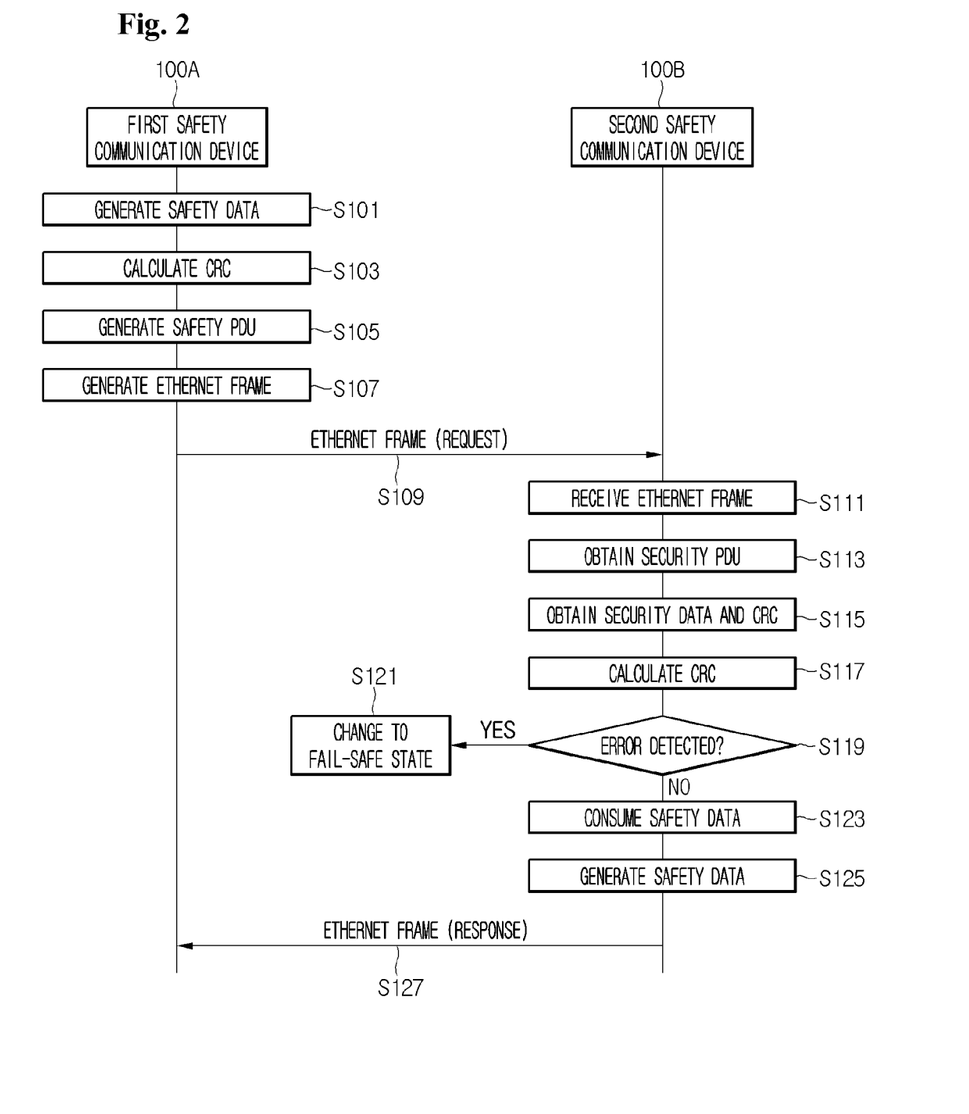
FIG. 2 is a ladder diagram illustrating a communication method according to an embodiment.

FIG. 2 is a ladder diagram illustrating a communication method according to an embodiment.

As illustrated in FIG. 2, it is assumed that a first safety communication device 100A communicates with a second communication device 100B, the first safety communication device 100A transmits a safety protocol data unit request to the second safety communication device 100B, and the second safety communication device 100B transmits a safety protocol data unit response to the first safety communication device 100A.

The control unit 190 of the first safety communication device 100A generates the safety data for a request (operation S101). The control unit 190 of the first safety communication device 100A may generate safety header data related to the request safety data together with the request safety data. The safety header data and the safety data according to an embodiment will be described with reference to FIG. 2.

Figure 3:
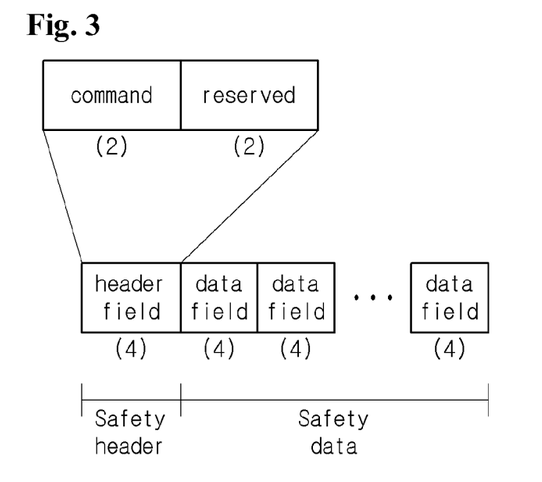
FIG. 3 illustrates safety data according to an embodiment.

FIG. 3 illustrates the safety header data and the safety data according to an embodiment.

As illustrated in FIG. 3, the safety header data according to an embodiment may be represented by a safety header field. The safety header field may include a command field related to the safety data and a reserved field.

Table 2 shows examples of values of the command field according to an embodiment.

TABLE 2

| Command | Description |
| --- | --- |
| 0x01 | RESET |
| 0x02 | CONNECTION |
| 0x03 | PARAMETER |
| 0x04 | DATA |

As shown in Table 2, if the value of the command field is 0x01, the safety data may represent a reset command. If the value of the command field is 0x02, the safety data may represent a connection command. If the value of the command field is 0x03, the safety data may represent a parameter transmission command. If the value of the command field is 0x04, the safety data may represent a data transmission command.

In particular, the embodiment of FIG. 2 may correspond to a communication method in a connection state in which the command field has the value corresponding to the connection command. In the connection state, the first safety communication device 100A may correspond to an initiator, and the second safety communication device 100B may correspond to a responder. The initiator is in a mode in which the request safety data is transmitted to the responder but response safety data is not transmitted. The responder is in a mode in which the response safety data is transmitted to the initiator but the request safety data is not transmitted.

The reserved field may be used later for other purposes.

In particular, in the embodiment of FIG. 3, the safety header field has a size of 4 octets, the command field has a size of 2 octets, the reserved field has a size of 2 octets, and the data field has a size of 4 octets; however, the sizes of the fields are not necessarily limited thereto. One octet generally represents 8 bits.

FIG. 2 will be described again.

The error detection code calculation unit 110 of the first safety communication device 100A calculates a data error detection code for the safety data using the safety data (operation S103). Here, the error detection code calculation unit 110 of the first safety communication device 100A may calculate a header error detection code for the safety header data using the safety header data. The error detection code may be a cyclic redundancy check (CRC) value. The calculation of the error detection code according to an embodiment will be described with reference to FIG. 4.

Figure 4:
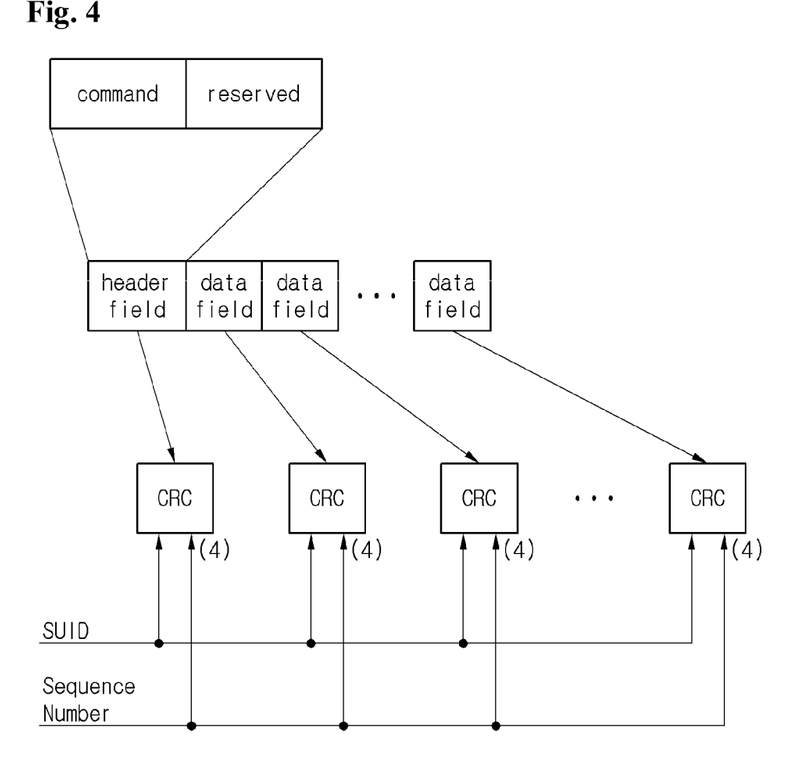
FIG. 4 illustrates a process of calculating an error detection code according to an embodiment.

FIG. 4 illustrates a process of calculating the error detection code according to an embodiment.

As illustrated in FIG. 4, the error detection code calculation unit 110 of the first safety communication device 100A may calculate the header error detection code for detecting an error of the header data field using the header data field.

Furthermore, the error detection code calculation unit 110 of the first safety communication device 100A may calculate a plurality of data error detection codes for detecting errors of a plurality of data fields using the plurality of data fields.

The plurality of data error detection codes may correspond to the plurality of data fields respectively. Here, the error detection code calculation unit 110 of the first safety communication device 100A may calculate each data error detection code using a corresponding data field, without using data fields other than the corresponding data field.

In particular, as shown in Equation 1 below, the error detection code calculation unit 110 of the first safety communication device 100A may calculate the header error detection code HEADER_CRC using a header field, a unique identifier and a sequence number. Here, the unique identifier may be a safety unique identifier (SUID).

$$\text{HEADER\_CRC}{:=}f(\text{SUID},\text{Sequence\_Number},\text{Header\_field}) \quad \text{Equation 1}$$

In Equation 1, f denotes a hash function.

The safety unique identifier may represent a connection relationship between the first safety communication device 100A and the second safety communication device 100B. In particular, the safety unique identifier may be generated by combining a source media access control (MAC) address, a source device identifier, a destination MAC address, and a destination device identifier. Since the first safety communication device 100A transmits the safety data and the second safety communication device 100B receives the safety data, the first safety communication device 100A is a source and the second safety communication device 100B is a destination. In this case, the safety unique identifier may be a combination of a MAC address of the first safety communication device 100A, a device identifier of the first safety communication device 100A, a MAC address of the second safety communication device 100B, and a device identifier of the second safety communication device 100B. The safety unique identifier may be used only for calculating the error detection code, without being included in the safety PDU.

The sequence number may represent a sequence number of the safety PDU. The sequence number used for calculating the error detection code may be a virtual sequence number that is not included in the safety PDU. That is, the first safety communication device 100A uses the virtual sequence number to calculate the error detection code, but does not transmit the virtual sequence number to the second safety communication device 100B.

As shown in Equation 2 below, the error detection code calculation unit 110 of the first safety communication device 100A may calculate each error detection code DATA_CRC[i] using a corresponding data field data[i], the command field, the unique identifier and the sequence number.

$$\text{DATA\_CRC}[i]{:=}f(\text{SUID},\text{Sequence\_Number},\text{Data\_field}[i]) \quad \text{Equation 2}$$

In Equation 2, f denotes a hash function.

As illustrated in FIG. 4, the header error detection code and the data error detection code have a size of 4 octets, but the sizes of the codes are not limited thereto.

FIG. 2 will be described again.

The protocol data unit generation unit 120 of the first safety communication device 100A generates the safety protocol data unit including the safety data and the calculated data error detection code. Here, the safety protocol data unit may further include the safety header data and the calculated header error detection code. A structure of the safety protocol data unit according to an embodiment will be described with reference to FIG. 5.

Figure 5:
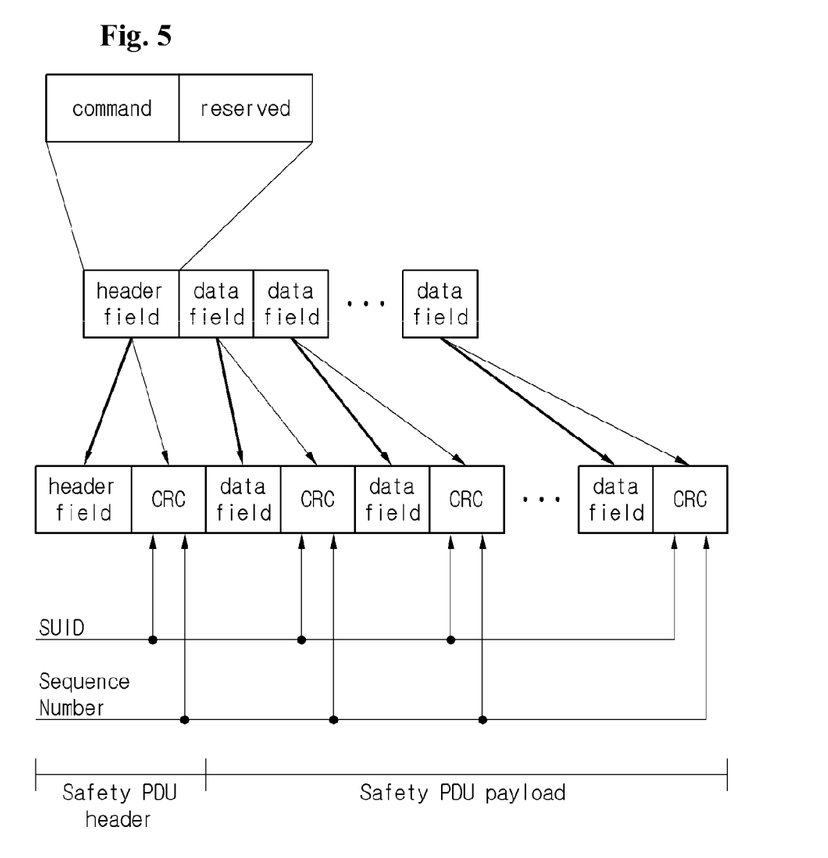
FIG. 5 illustrates a structure of a safety protocol data unit according to an embodiment.

FIG. 5 illustrates the structure of the safety protocol data unit according to an embodiment.

As illustrated in FIG. 5, the safety protocol data unit sequentially includes a safety PDU header and a safety PDU payload. The safety PDU header sequentially includes the safety header field and the header error detection code. The safety PDU payload includes a plurality of safety data fields and a plurality of data error detection codes. In particular, the safety PDU header may be arranged at a forefront of the safety protocol data unit. Furthermore, the plurality of safety data fields and the plurality of data error detection codes may alternately follow the safety PDU header. Here, each data error detection code may immediately follow a corresponding safety data field.

FIG. 2 will be described again.

The Ethernet frame generation unit 130 of the first safety communication device 100A generates an Ethernet frame including the request safety data (operation S107). Here, the Ethernet frame may include the generated safety protocol data unit. A structure of the Ethernet frame according to an embodiment will be described with reference to FIG. 6.

Figure 6:
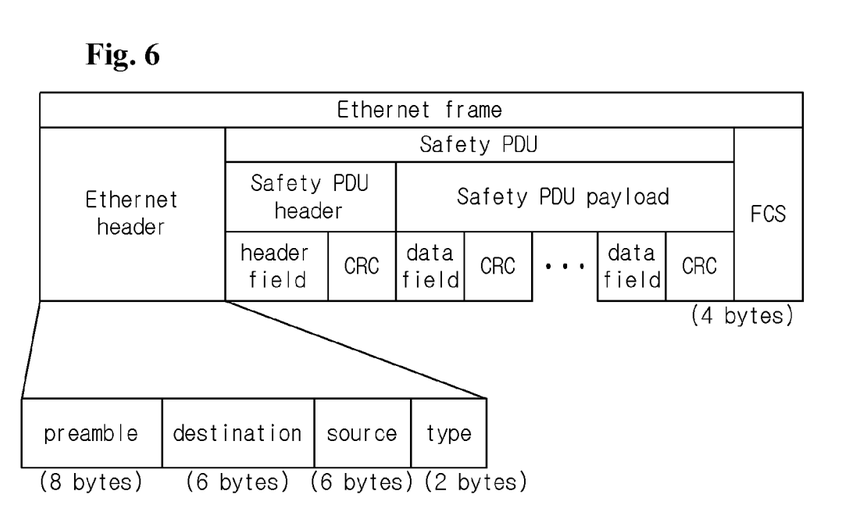
FIG. 6 illustrates a structure of an Ethernet frame according to an embodiment.

FIG. 6 illustrates the structure of the Ethernet frame according to an embodiment.

As illustrated in FIG. 6, the Ethernet frame sequentially includes an Ethernet header, an Ethernet payload, and a frame check sequence (FCS). The Ethernet frame includes the safety PDU as the payload. The Ethernet frame header includes a preamble field, a destination address field, a source address field, and a type field. The destination address field contains an address of a safety communication device corresponding to a destination, and the source address field contains an address of a safety communication device corresponding to a source. The frame check sequence may be generated using data within the Ethernet header and data within the payload.

FIG. 2 will be described again.

The data transmission unit 140 of the first safety communication device 100A transmits the Ethernet frame including the request safety data to the second safety communication device 100B (operation S109). In this manner, the data transmission unit 140 may transmit the generated safety protocol data unit to the second safety communication device 100B.

The data receiving unit 150 of the second safety communication device 100B receives, from the first safety communication device 100A, the Ethernet frame including the safety protocol data unit including the request safety data (operation S111). Here, the Ethernet frame may have the structure as illustrated in FIG. 6.

The Ethernet frame analysis unit 160 of the second safety communication device 100B analyzes the received Ethernet frame to obtain the safety protocol data unit (operation S113). Here, the safety protocol data unit may have the structure as illustrated in FIG. 5.

The protocol data unit analysis unit 170 of the second safety communication device 100B analyzes the protocol data unit to obtain the safety header data, a received header error detection code, the request safety data, and a received data error detection code (operation S115). Here, the protocol data unit analysis unit 170 of the second safety communication device 100B may obtain the safety header field, the received header error detection code, a plurality of request safety data fields, and a plurality of received data error detection codes.

The error detection unit 180 of the second safety communication device 100B calculates a comparative data error detection code using the request safety data (operation S117). In addition, the error detection unit 180 of the second safety communication device 100B may calculate a comparative header error detection code using the safety header data.

As described above, the error detection unit 180 of the second safety communication device 100B may calculate the comparative header error detection code for detecting an error of the header data field using the header data field. In particular, the error detection unit 180 of the second safety communication device 100B may calculate the comparative header error detection code using Equation 1.

The error detection unit 180 of the second safety communication device 100B may calculate the plurality of data error detection codes for detecting errors of the plurality of data fields using the plurality of data fields. The plurality of data error detection codes may correspond to the plurality of data fields respectively. Here, the error detection unit 180 of the second safety communication device 100B may calculate each data error detection code using a corresponding data field, without using data fields other than the corresponding data field. In particular, the error detection unit 180 of the second safety communication device 100B may calculate each error detection code using Equation 2.

The error detection unit 180 of the second safety communication device 100B compares a calculated error detection code with a received error detection code to detect an error (operation S119). In the case where all of the plurality of comparative data error detection codes are equal to the plurality of received data error detection codes and the comparative header error detection code is equal to the received header error detection code, the error detection unit 180 may determine that an error has not occurred in the safety data. On the contrary, in the case where any one of the plurality of comparative data error detection codes is different from the received data error detection code or the comparative header error detection code is different from the received header error detection code, the error detection unit 180 may determine that an error has occurred in the safety data.

When it is determined that an error has occurred in the safety data, the control unit 190 of the second safety communication device 100B changes the operation state of the safety communication device 100 into the fail-safe state (operation S121). In the fail-safe state, the safety communication device 100 suspends the safety communication until the user input for reset is received. In particular, in the fail-safe state, the safety communication device 100 may or may not suspend communication other than the communication related to the safety data, but suspends at least the communication related to the safety data.

When it is determined that an error has not occurred in the safety data, the control unit 190 of the second safety communication device 100B consumes the received request safety data (operation S123), and generates the response safety data to be transmitted next (operation S125).

The error detection code calculation unit 110, the protocol data unit generation unit 120, the Ethernet frame generation unit 130, and the data transmission unit 140 of the second safety communication device 100B generate the Ethernet frame including the response safety PDU including the response safety data, as described above with respect to operations S101 to S109, and then transmit the Ethernet frame to the first safety communication device 100A (operation S127).

The data receiving unit 150, the Ethernet frame analysis unit 160, the protocol data unit analysis unit 170, the error detection unit 180, and the control unit 190 of the first safety communication device 100A receive the Ethernet frame including the response safety PDU, perform error detection and consume response safety data as described above with respect to operations S111 to S123.

According to an embodiment, the above-mentioned methods may be implemented with processor-readable codes in a program-recorded medium. A processor-readable recording medium includes, for example, a ROM, a RAM, a CD-ROM, a magnetic tape, a floppy disk, and an optical data storage device, and may also be implemented in the form of a carrier wave (for example, transmission via the Internet).

The above-mentioned mobile terminals are not limited to the configuration and methods of the above-mentioned embodiments. The entirety or part of each embodiment may be selectively combined with each other to make various medications.

The invention claimed is:

1. A communication method for a first communication device transmitting data to a second communication device, the communication method comprising:
    calculating a plurality of data error detection codes for detecting an error of a plurality of data fields, wherein the plurality of data error detection codes correspond to the plurality of data fields respectively;
    calculating a header error detection code for detecting an error of a header field, the header error detection code calculated using the header field, a unique identifier and a sequence number;
    generating a packet including the header field, the plurality of data fields, the plurality of data error detection codes and the header error detection code;
    forming a frame comprising a header and a payload, the header including a preamble field, a destination address field, a source address field and a type field and the payload including the generated packet; and
    transmitting the frame to the second communication device, wherein a number of the plurality of data error detection codes is increased according to a number of the plurality of data fields,
wherein the unique identifier is generated by using a source media access control (MAC) address, a source device identifier, a destination MAC address and a destination device identifier,
wherein the source MAC address, the source device identifier, the destination MAC address and the destination device identifier are not included in the generated packet,
wherein each of the plurality of data error detection codes is calculated by using the unique identifier and the corresponding plurality of data fields without using data fields other than the corresponding plurality of data fields,
wherein the header field and the header error detection code are arranged at a front of the packet,
wherein the plurality of data fields and the plurality of data error detection codes are alternately arranged in the packet,
wherein each of the plurality of data error detection codes immediately follows the corresponding plurality of data fields in the packet,
wherein the unique identifier represents a connection relationship between the first communication device and the second communication device,
wherein the sequence number represents a sequence number of the packet and is not included in the packet,
wherein the plurality of data error detection codes are calculated by using corresponding safety data, the unique identifier and the sequence number,
wherein the sequence number is not transmitted to the second communication device,
wherein the safety data is related to a command field,
wherein if a value of the command field is a first value, the safety data represents a reset command,
wherein if the value of the command field is a second value, the safety data represents a connection command,
wherein if the value of the command field is a third value, the safety data represents a parameter transmission command, and
wherein if the value of the command field is a fourth value, the safety data represents a data transmission command.

2. A communication method for a first communication device receiving data from a second communication device, the communication method comprising:
receiving a frame from the second communication device, the frame comprising a header and a payload, the header including a preamble field, a destination address field, a source address field and a type field and the payload including a packet, the packet including a header field, a plurality of data fields, a plurality of data error detection codes and a header error detection code;
obtaining the plurality of data fields, the plurality of data error detection codes, the header field and the header error detection code from the packet, wherein the plurality of data error detection codes correspond to the plurality of data fields respectively;
calculating a plurality of comparative data error detection codes using the plurality of data fields;
calculating a comparative header error detection code for detecting an error of the header field;
determining whether the packet has an error by using the plurality of data error detection codes and the plurality of comparative data error detection codes; and
changing an operation state to a state in which communication is suspended until a user input is received when the packet is determined as having an error,
wherein a number of the plurality of data error detection codes is increased according to a number of the plurality of data fields,
wherein the plurality of data error detection codes are calculated by using a unique identifier,
wherein the unique identifier is generated by using a source media access control (MAC) address, a source device identifier, a destination MAC address and a destination device identifier,
wherein the source MAC address, the source device identifier, the destination MAC address and the destination device identifier are not included in a safety protocol data unit (PDU),
wherein each of the plurality of comparative data error detection codes corresponds to one of the plurality of data fields and is calculated by using the corresponding one of the plurality of data fields without using data fields other than the corresponding one of the plurality of data fields,
wherein each of the plurality of comparative data error detection codes further corresponds to one of the plurality of received data error detection codes,
wherein the header field and the header error detection code are arranged at a front of the packet,
wherein the plurality of data fields and the plurality of data error detection codes are alternately arranged in the packet,
wherein each of the plurality of data error detection codes immediately follows the corresponding plurality of data fields in the packet,
wherein determining whether the packet has an error comprises:
comparing each of the plurality of comparative data error detection codes with the corresponding one of the plurality of data error detection codes;
determining that the packet has no error if each of the plurality of comparative data error detection codes is equal to the corresponding one of the plurality of data error detection codes and the comparative header error detection code is equal to the header error detection code; and
determining that the packet has an error if any one of the plurality of comparative data error detection codes is different from the corresponding one of the plurality of received data error detection codes or the comparative header error detection code is different from the header error detection code, and
wherein the unique identifier represents a connection relationship between the first communication device and the second communication device,
wherein the plurality of data error detection codes are calculated by using safety data, the unique identifier and a sequence number,
wherein the safety data is related to a command field,
wherein if a value of the command field is a first value, the safety data represents a reset command,
wherein if the value of the command field is a second value, the safety data represents a connection command, wherein if the value of the command field is a third value, the safety data represents a parameter transmission command, and wherein if the value of the command field is a fourth value, the safety data represents a data transmission command.

\* \* \* \* \*